United States Patent
Porst et al.

(10) Patent No.: US 6,441,408 B2
(45) Date of Patent: Aug. 27, 2002

(54) POWER SEMICONDUCTOR COMPONENT FOR HIGH REVERSE VOLTAGES

(75) Inventors: Alfred Porst; Helmut Strack, both of München; Anton Mauder, Kolbermoor; Hans-Joachim Schulze, Ottobrunn; Heinrich Brunner, Dorfen; Josef Bauer, Markt Indersdorf; Reiner Barthelmess, Eltmann, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/761,241

(22) Filed: Jan. 17, 2001

Related U.S. Application Data

(63) Continuation of application No. PCT/DE99/01956, filed on Jul. 1, 1999.

(51) Int. Cl.[7] .......................... H01L 33/00; H01L 29/88; H01L 29/74
(52) U.S. Cl. ....................... 257/139; 257/139; 257/147; 257/341; 257/103; 257/104
(58) Field of Search .................................. 257/139, 147, 257/341, 104, 103, 175, 140, 146

(56) References Cited

U.S. PATENT DOCUMENTS

| | | | | |
|---|---|---|---|---|
| 4,517,582 A | * | 5/1985 | Sittig | 357/38 |
| 4,980,742 A | * | 12/1990 | Stengl et al. | 357/38 |
| 5,668,385 A | | 9/1997 | Bauer et al. | |
| 6,081,540 A | * | 6/2000 | Nakatsu | 372/45 |

FOREIGN PATENT DOCUMENTS

| | | |
|---|---|---|
| DE | 39 17 769 A1 | 12/1990 |
| DE | 40 13 626 C1 | 5/1991 |
| EP | 0 214 485 A2 | 3/1987 |
| EP | 0 760 528 A2 | 3/1997 |
| EP | 0 621 640 B1 | 6/1998 |

* cited by examiner

Primary Examiner—Jerome Jackson, Jr.
Assistant Examiner—Joseph Nguyen
(74) Attorney, Agent, or Firm—Laurence A. Greenberg; Werner H. Stemer; Ralph E. Locher

(57) ABSTRACT

A power semiconductor components has stop zones. In order to optimize the static and dynamic losses of the power semiconductor components, the stop zone is provided with donors which have at least one donor level which lies within the band gap of silicon and is at least 200 meV away from the conduction band edge of silicon.

25 Claims, 4 Drawing Sheets

POWER SEMICONDUCTOR COMPONENT FOR HIGH REVERSE VOLTAGES

CROSS REFERENCE TO RELATED APPLICATION

This application is a continuation of International Application No. PCT/DE99/01956, filed Jul. 1, 1999, which designated the United States.

BACKGROUND OF THE INVENTION

Field of the Invention

The invention relates to power semiconductor components, in particular for high reverse voltages. The power semiconductor components include an n-doped silicon layer, into which a plurality of n- or p-doped layers are introduced between a first main area and a second main area. A cathode is assigned to the first main area and is formed by a first metallization layer. An anode, which is formed by a second metallization layer, covers the second main area.

Such power semiconductor components can be constructed in such a way that the layers, as seen from the second main area, include a p-doped anode zone, an n-doped stop layer which has a higher dopant concentration than a silicon layer which adjoins the stop layer.

Such components are widely known as bipolar transistors, thyristors or as field effect-controllable bipolar power semiconductor components, such as insulated gate bipolar transistors and are presented in U.S. Pat. No. 5,668,385 for example.

In another embodiment, the above-mentioned power semiconductor components can have layers which, as seen from the second main area, include a p-doped anode zone and, adjoining the latter, the n-doped silicon layer, adjoining that a stop layer, which has a higher dopant concentration than the n-doped silicon layer, and adjoining the stop layer an n-doped cathode zone.

Such power semiconductor components are generally known as diodes, and may either be present as discrete actual components or be contained as parasitic diodes in other power semiconductor components such as e.g. in power MISFETs (Metal-Insulator-Semiconductor Field-Effect Transistors). In a power MISFET, as is known, a parasitic $p^+$-$n^-$-$n^+$ diode is reverse-connected in parallel with the actual MISFET from the source to the drain. Such power semiconductor components are likewise presented in U.S. Pat. No. 5,668,385 for example.

Such stop layers have hitherto been fabricated predominantly by deep diffusions which, however, require very long diffusion times. Furthermore, the doping profile also cannot be freely chosen as is disclosed in Published European Patent Application EP 0 214 485 A1.

Moreover, it is also known to deposit such stop layers epitaxially on a heavily n-doped substrate. However, epitaxy is a very expensive method, in particular with regard to the layer thicknesses required in power semiconductor components, and, in addition, has the problem that undesired, excessively high defect densities are quite often produced.

SUMMARY OF THE INVENTION

It is accordingly an object of the invention to provide a power semiconductor component which overcomes the abovementioned disadvantages of the heretofore-known components of this general type and which has a stop layer that does not have to be deposited epitaxially and which can be fabricated without necessitating lengthy deep diffusions.

With the foregoing and other objects in view there is provided, in accordance with the invention, a power semiconductor component, in particular for high reverse voltages, including:

an n-doped silicon layer;

a first main area and a second main area;

a plurality of doped layers introduced into the n-doped silicon layer between the first main area and the second main area;

the doped layers, as seen from the second main area, including a p-doped anode zone and an n-doped stop layer adjoining the p-doped anode zone;

the n-doped silicon layer having a first dopant concentration, the n-doped stop layer having a second dopant concentration higher than the first dopant concentration, the n-doped stop layer adjoining and completely covering the n-doped silicon layer;

the n-doped stop layer being doped with at least one dopant having at least one donor level between a valence band edge of silicon and a conduction band edge of silicon and the at least one donor level being more than 200 meV away from the conduction band edge of silicon;

a cathode assigned to the first main area and formed by a first metallization layer; and an anode formed by a second metallization layer covering the second main area.

With the objects of the invention in view there is also provided, a power semiconductor component, in particular for high reverse voltages, including:

an n-doped silicon layer;

a first main area and a second main area;

a plurality of doped layers introduced into the n-doped silicon layer between the first main area and the second main area;

the doped layers, as seen from the second main area, including an anode zone, the n-doped silicon layer adjoining the anode zone, a stop layer adjoining the n-doped silicon layer, and an n-doped cathode zone adjoining the stop layer;

the n-doped silicon layer having a first dopant concentration, the stop layer having a second dopant concentration higher than the first dopant concentration, the stop layer completely covering the n-doped silicon layer;

the stop layer being doped with at least one dopant having at least one donor level between a valence band edge of silicon and a conduction band edge of silicon and the at least one donor level being more than 200 meV away from the conduction band edge of silicon;

a cathode assigned to the first main area and formed by a first metallization layer; and an anode formed by a second metallization layer covering the second main area.

With the objects of the invention in view there is also provided, a semiconductor component, including:

a MISFET having a source, a drain, and a parasitic diode;

the parasitic diode being reverse-connected in parallel from the source to the drain and the parasitic diode including:

an n-doped silicon layer;

a first main area and a second main area;

a plurality of doped layers introduced into the n-doped silicon layer between the first main area and the second main area;

the doped layers, as seen from the second main area, including an anode zone, the n-doped silicon layer adjoining the anode zone, and a stop layer adjoining the n-doped silicon layer;

the n-doped silicon layer having a first dopant concentration, the stop layer having a second dopant concentration higher than the first dopant concentration, the stop layer completely covering the n-doped silicon layer;

the stop layer being doped with at least one dopant having at least one donor level between a valence band edge of silicon and a conduction band edge of silicon and the at least one donor level being more than 200 meV away from the conduction band edge of silicon;

a cathode assigned to the first main area and formed by a first metallization layer; and an anode formed by a second metallization layer covering the second main area.

According to another feature of the invention, the at least one dopant includes selenium and/or sulfur.

According to another feature of the invention, the n-doped stop layer has a depth of between 1 $\mu$m and 50 $\mu$m.

According to yet another feature of the invention, the p-doped anode zone is embodied as a transparent emitter with a given depth and a given dopant concentration selected such that at least 50% of a total current flowing through the transparent emitter is carried by electrons. The given depth of the transparent emitter is preferably between 0.5 $\mu$m and 5 $\mu$m.

According to another feature of the invention, a plurality of IGBT (Insulated Gate Bipolar Transistor) cells including p-doped base zones and n-doped source zones are introduced from the first main area. The cathode is electrically conductively connected to the p-doped base zones and the n-doped source zones. A gate electrode is provided above the first main area and between respective two of the IGBT cells. An insulator insulating the gate electrode is also provided.

According to another feature of the invention, a p-doped base introduced from the first main area is provided. A plurality of n-doped cathode zones is introduced into the p-doped base, and the n-doped cathode zones are electrically conductively connected to the cathode.

According to another feature of the invention, a plurality of MCT (MOS-controlled thyristor) structures each including a p-type base, an n-type emitter, a channel region and a p-type short region is introduced from the first main area; and an insulated gate electrode is disposed above the first main area and between respective two of the MCT structures.

The object of the invention is achieved by virtue of the fact that the stop layer is doped with at least one dopant which has at least one donor level which lies between the valence band edge and the conduction band edge of silicon and is more than 200 meV away from the conduction band edge of the silicon. Such dopants are, in particular, sulfur or selenium. Sulfur has two donor levels, namely at 260 meV and 480 meV, and selenium has two donor levels, namely at 310 meV and 590 meV, below the conduction band edge.

Compared with the technically widespread donors, phosphorus, arsenic and antimony, whose energy levels are less than 50 meV away from the conduction band edge, this means that in the customary operating temperature range of power semiconductor components composed of silicon, i.e. in a temperature interval of approximately −55° C. to +175° C., only a very small proportion of the donor atoms is in thermal equilibrium in the ionized state.

Accordingly, the stop layer in the power semiconductor components according to the invention is "active" only in the reverse mode or blocking mode of the power semiconductor component but not, however, in the forward mode. In other words, the number of atoms, which are produced by the impurities in the stop layer and act as dopants, changes depending on the operating mode of the power semiconductor component. This is achieved by virtue of the fact that, through the doping atoms, donor levels are provided which lie within the band gap of the silicon far away from the conduction band edge and from the valence band edge.

A further advantage of the use of sulfur or selenium as dopant is that the diffusion constants of both elements in silicon are very high compared with the dopants according to the prior art. The diffusion coefficients are shown in the comparison in FIGS. 5 and 6, which show a diffusion coefficient D of impurities in silicon versus reciprocal temperature 1/T.

The stop layer preferably has a dopant concentration $N_D$ of between $5 \times 10^{14}$ cm$^{-3}$ and $5 \times 10^{15}$ cm$^{-3}$, the stop layer having a depth of between 15 $\mu$m and 35 $\mu$m in the case of power diodes and having a depth of between 10 $\mu$m and 25 $\mu$m in the case of IGBTs (Insulated Gate Bipolar Transistors) and other controllable power semiconductor components.

Furthermore, the power semiconductor components according to the invention have an anode structure which optimizes the stop layer according to the invention for the anode-side limiting of the electric field in combination with provisions for the maximum anode-side extraction of charge carriers during the turn-off operation.

This is achieved by an anode emitter which is embodied as a transparent emitter and whose depth and charge carrier concentration are preferably chosen such that at least 50% of a total current flowing through the emitter is carried by electrons. A transparent emitter is to be understood hereinafter as an anodal emitter layer which is configured in such a way that a significant proportion of the total current leaves the anode metallization layer of the power semiconductor component as an electron current. This electron current specified in percent of the total current is referred to as emitter transparency. The emitter transparency is set by the depth and edge concentration of the anode emitter. As a result, high tail currents are avoided in the controllable semiconductor components according to the invention. By varying the depth of the stop layer, its maximum dopant concentration and its doping gradient, on the one hand, and by setting the dopant concentration and depth of the transparent emitter, on the other hand, it is possible to set a broad spectrum of turn-off current profiles over time. In other words, from an abrupt current chopping with minimal switch-off losses (hard recovery) through to a soft decay of the current with only slightly higher turn-off losses (soft recovery), all desired and conceivable switch-off current profiles can be attained.

The combination of the transparent anode emitter with the stop layer thus has the effect, inter alia, that during the turnoff operation the space charge zone penetrates into the stop layer and shifts or pushes the charge through the transparent emitter from i.e. out of the power semiconductor component. As a consequence of this, the current falls to 0 in a very short time, without the slowly falling tail currents which are typical in conventional structures. As a result, the turn-off losses are drastically minimized.

In a power diode, the stop layer is provided on the cathode side rather than on the anode side. In the power diode, as is known, the current changes its direction during the transition from the forward mode to the reverse mode. This phenomenon is known as "reverse recovery" in the literature. As explained above, the cathodal stop layer in the power diode prevents abrupt chopping of the current at the end of the reverse recovery phase. In a power diode, too, the transparent anode emitter can advantageously be combined with the cathodal stop layer since the simultaneous use of these two provisions can effect the minimization of the power diode thickness, in other words the minimization of the weakly n-doped layer between anode and cathode, in conjunction with weak injection from the anode side. This is the most effective way of reducing the reverse current peak. The cathodal stop layer thus ensures that the decay of the power diode reverse current is a soft process (soft recovery).

If the emitter transparency is set very high, then the forward resistance generally becomes too high for practical applications. However, this disadvantage can be remedied in a simple way by the transparent anode emitter being interspersed with heavily p-doped islands. This special embodiment corresponds to a further, preferred embodiment and can be employed both in power diodes and in controllable power semiconductor components.

In IGBTs, the power semiconductor components have, from the cathodal main area, a multiplicity of IGBT cells including p-doped base zones and n-doped source zones embedded therein, the cathode being electrically conductively connected to the base zones and source zones. Above the cathodal main area, a gate electrode which is insulated trough the use of an insulator is then provided between two respective IGBT cells.

In thyristors, from the cathodal main area, a p-doped base zone and, in the latter, a plurality of n-doped cathode zones are introduced, the cathode zones being electrically conductively connected to the cathode.

In the IGBTs, the transparent anode emitter preferably has a depth of less than 1 μm, whereas in power diodes the transparent anode emitter typically has a depth of between 0.5 μm and 5 μm.

It is again emphasized that the stop layers according to the invention can also be used in a targeted manner in parasitic diode structures, i.e. the invention also extends inter alia to unipolar power semiconductor components. It is generally known that power MOSFETs have a parasitic diode structure reverse-connected in parallel with the actual power MOSFET from the source to the drain. For its part, this parasitic power diode has a diffusion capacitance and/or a depletion-layer capacitance which must be taken into account during the development and dimensioning of power MOSFETs. Accordingly, here too the invention opens up new ways of dimensioning and developing unipolar power semiconductor components.

Other features which are considered as characteristic for the invention are set forth in the appended claims.

Although the invention is illustrated and described herein as embodied in a power semiconductor component for high reverse voltages, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
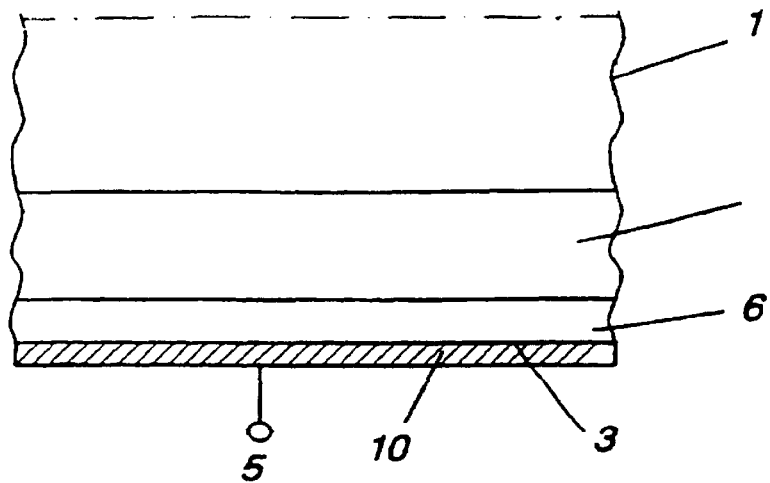
FIG. 1a is a diagrammatic, partial sectional view of a structure including a stop layer according to the invention for a controllable power semiconductor component with a transparent emitter.
Figure 1B:
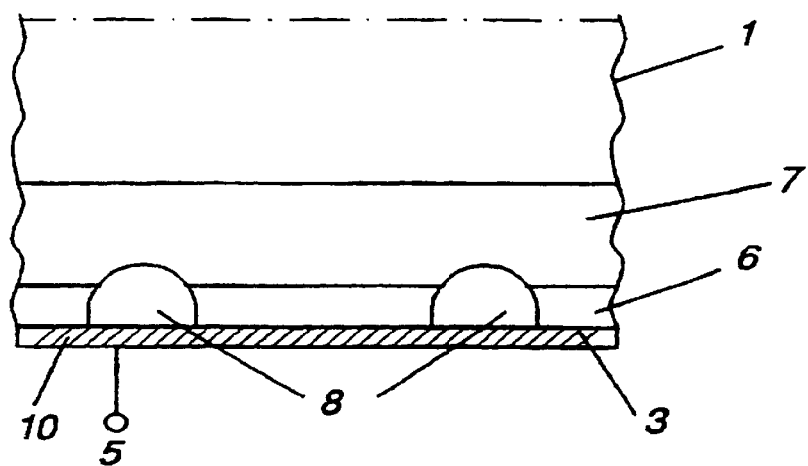
FIG. 1b is a diagrammatic, partial sectional view of a structure including a stop layer according to the invention for a controllable power semiconductor component with a transparent emitter and heavily p-doped emitter islands.

Referring now to the figures of the drawings in detail and first, particularly, to FIG. 1a thereof, there is shown a first embodiment of the invention. A further embodiment of the invention has heavily p-doped emitter islands 8 introduced into the transparent emitter 6. Such an anode structure is illustrated in FIG. 1b. It can be used for an IGBT (Insulated Gate Bipolar Transistor), an MCT (MOS-controlled thyristor) and a GTO (gate turn-off thyristor). The depth of these emitter islands is 5 μm, for example, and the dopant concentration at the edge is approximately $10^{19}$ cm$^{-3}$. The use of such heavily p-doped emitter islands 8 means that the forward resistance decreases further. A further advantage of the use of such emitter islands 8 is that the voltage rate dV/dt can be effectively limited.

Figure 3:
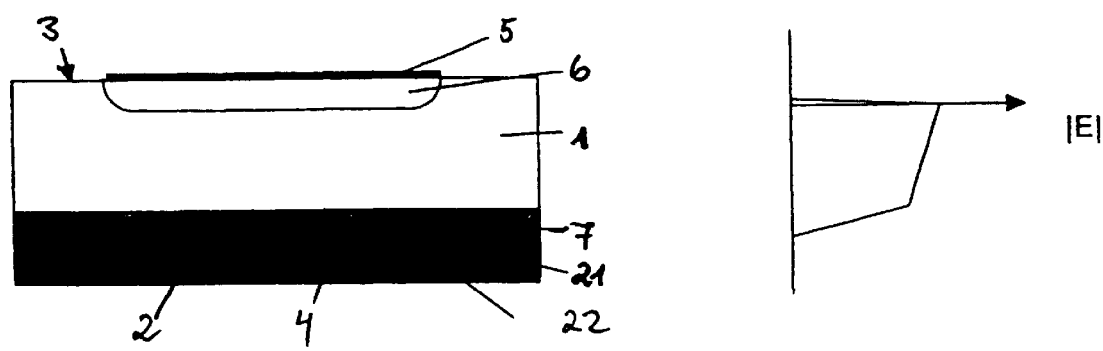
FIG. 3 is a diagrammatic sectional view of a power diode structure according to the invention.
Figure 4:
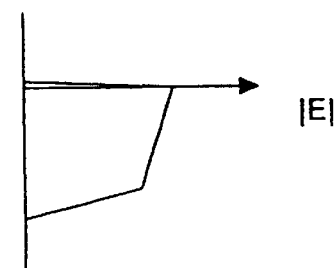
FIG. 4 is a graph illustrating the doping profile of the power diode according to FIG. 3.

Identical parts or elements are indicated with identical reference symbols in the figures. FIGS. 1 to 3 correspond to the figures in U.S. Pat. No. 5,668,385.

A power semiconductor component according to the invention includes a silicon layer 1, into which a plurality of layers of different doping are indiffused or implanted. These layers are bounded by two main areas 2; 3. The first main area 2 is assigned a cathode 4 and the second main area 3 is assigned an anode 5. The anode 5 and the cathode 4, respectively, are formed by corresponding metallization layers 10; 22.

Figure 2A:
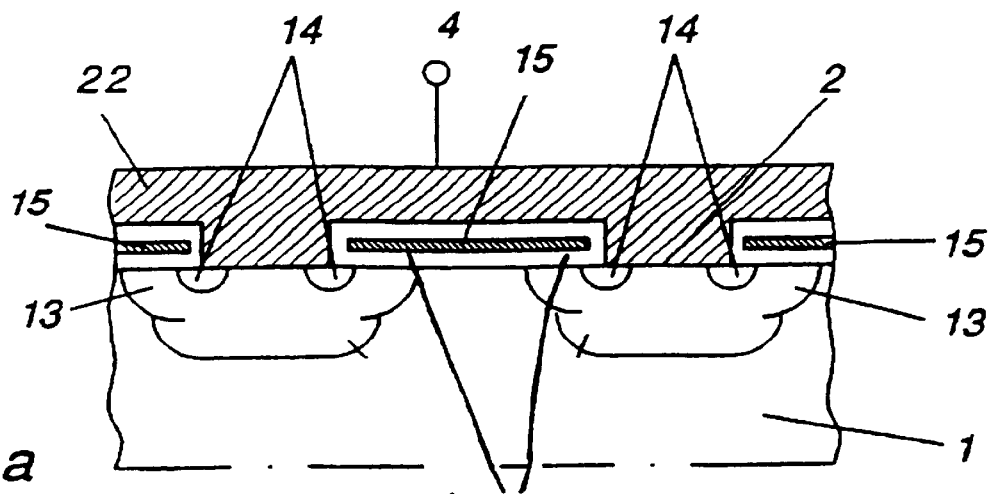
FIG. 2a is a diagrammatic, partial sectional view of a cathode structure of an IGBT (Insulated Gate Bipolar Transistor)
Figure 2B:
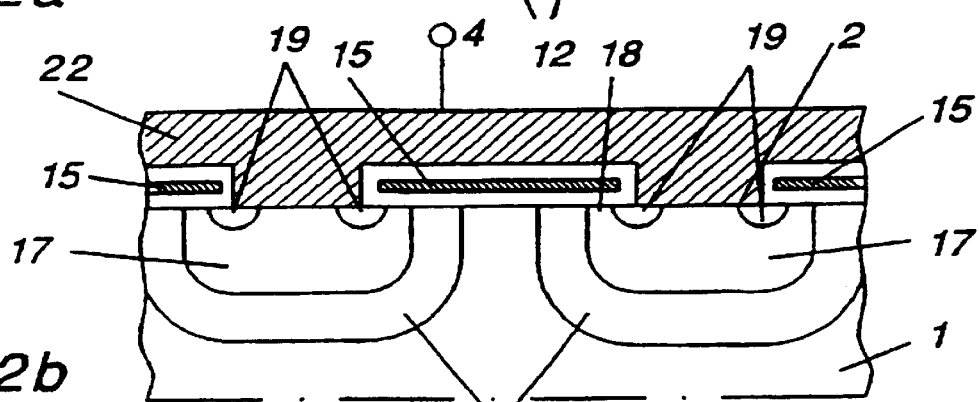
FIG. 2b is a diagrammatic, partial sectional view of a cathode structure of an MCT (MOS-controlled thyristor)
Figure 2C:
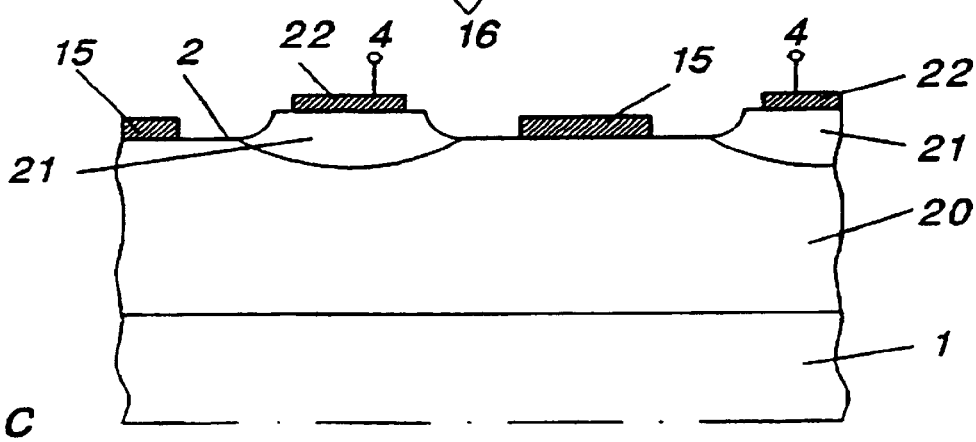
FIG. 2c is a diagrammatic, partial sectional view of a cathode structure of a GTO (gate turn-off thyristor)
Figure 5:
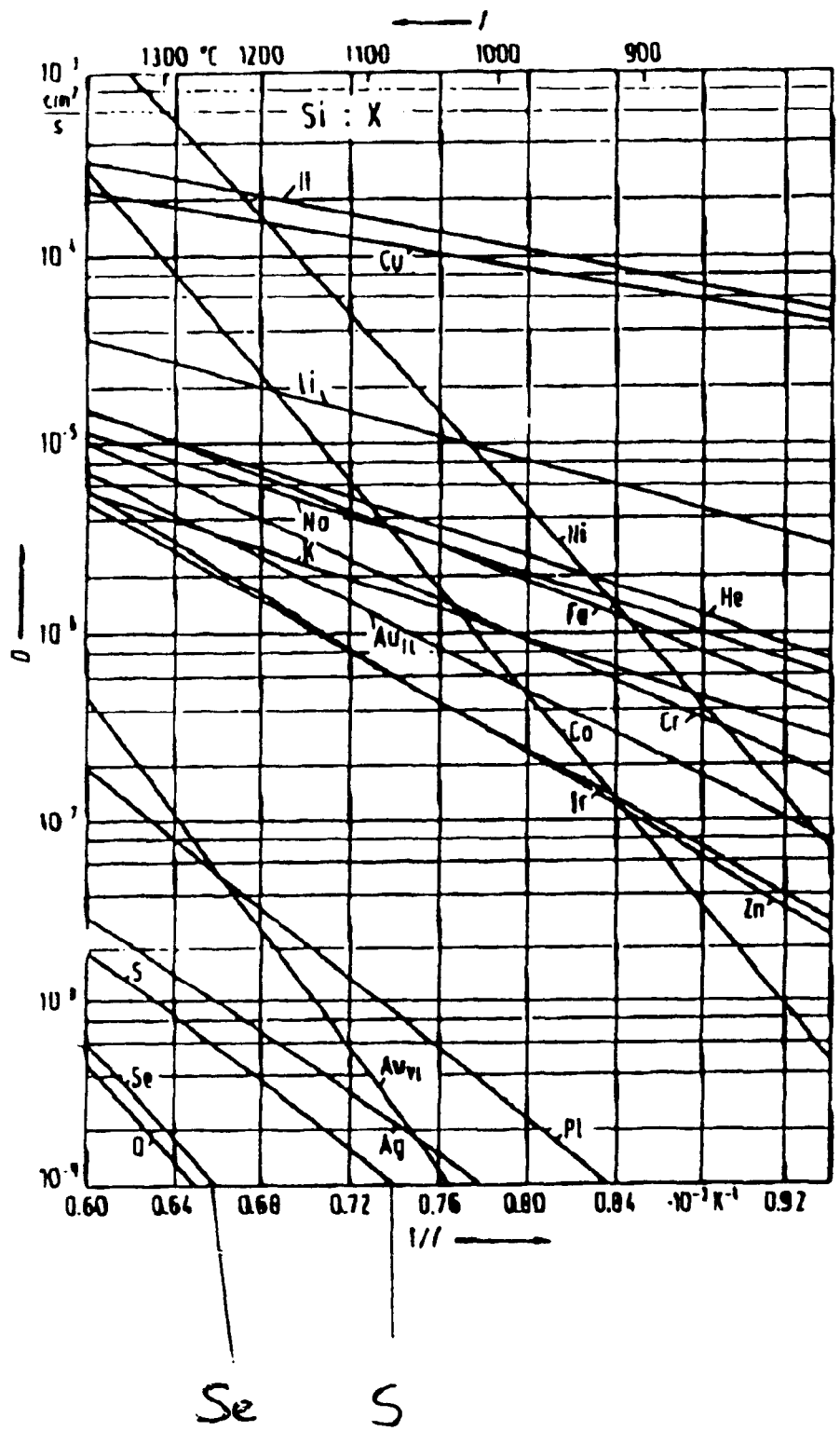
FIGS. 5 and 6 are graphs illustrating diffusion coefficients.
Figure 6:
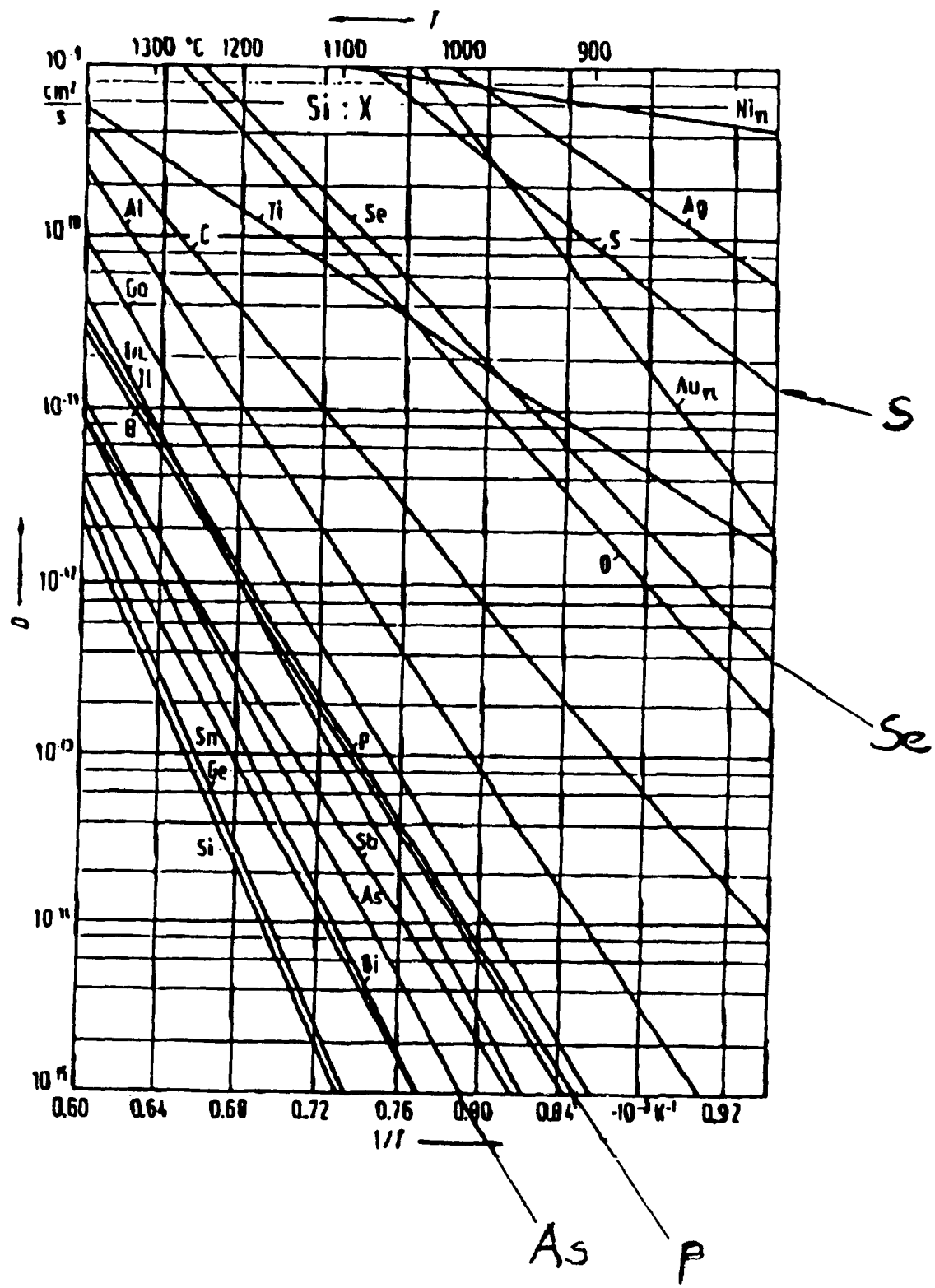

The cathodal or cathode-side structures for semiconductor switches such as IGBTs, MCTs and GTOs are illustrated in FIGS. 2a to c, and the anodal structures in FIGS. 1a to b.

In this case, the cathodal structures can be combined with the anodal structures in FIGS. 1a, b by being joined together along the dash-dotted line.

FIG. 1a shows a stop layer 7 according to the invention. The anodal structure shown there includes an anode metallization layer 10, a transparent emitter 6 and a stop layer 7. The stop layer 7 is followed by the silicon layer 1, which is n-doped. In the case of an IGBT, MCT or GTO, the silicon layer 1 simultaneously constitutes the n-type base. The transparent emitter 6 is preferably heavily p-doped and has e.g. a depth of less than 1.0 μm and a dopant concentration of $10^{18}$ cm$^{-3}$.

The subsequent stop layer 7 according to the invention is n-doped, preferably significantly more highly than the silicon layer 1. The stop layer 7 is doped with at least one dopant which has at least one donor level which lies between the valence band edge and the conduction band edge of silicon and is more than 200 meV away from the conduction band edge of the silicon. The dopants shown here are either selenium or sulfur or mixtures of selenium and sulfur.

Compared with the donors phosphorus, arsenic and antimony disclosed in the prior art, selenium and sulfur have the property that, at temperatures of between −55° C. and +175° C., only a very small portion of the donor atoms is, when in thermal equilibrium, in the ionized state. As a result, in the case of sulfur and selenium, given the same donor concentrations which are incorporated at lattice sites of the silicon and are thus electrically active, in the forward mode, the emitter properties of the anode 6 are altered significantly more weakly than would be the case with the conventional donors phosphorus, arsenic and antimony.

In an IGBT, MCT or a GTO, the stop layer 7 has a dopant concentration $N_D$ of between $5 \times 10^{14}$ cm$^{-3}$ and $5 \times 10^{15}$ cm$^3$. In IGBTs, the depth of the stop layer 7 is preferably between 10 μm and 25 μm.

If the stop layer 7 according to the invention is encompassed by a space charge zone, the donor atoms introduced there become completely active as donors, and active as double donors in the case of introduced sulfur, i.e. donors with two liberated charge carriers, so that a sulfur atom is doubly charged.

The energy levels of sulfur are so deep in the silicon band gap that they are completely electrically activated only when a space charge zone is applied. One donor level of sulfur lies 260 meV below the conduction band edge of the silicon and a second donor level lies 480 meV above the valence band edge of the silicon. The band gap of silicon is 1120 meV.

The effect thereby achieved is, on the one hand, that the stop layer 7 is only partly electrically active in the on state, so that the partial transistor gain factor $\alpha_{pnp}$ of the parasitic bipolar transistor formed by anode emitter 6, stop layer 7 and silicon layer 1 and also the p-doped cathode structures is reduced only relatively slightly and the forward voltage can, as a result, in turn be kept low.

On the other hand, that part of the stop layer 7 which is encompassed by the space charge zone is completely activated in the off state. In this case, the electric field reaches into the stop layer 7 according to the invention, where it ionizes all the donors, the electrons released there immediately being transported away via the electric field and, consequently, not being able to interact again with an ionized donor atom.

The intrinsically opposite requirements with regard to the forward voltage and reverse voltage imposed on a stop layer 7 can thus be significantly improved by the use of the donors according to the invention.

In an alternative embodiment, selenium is used instead of sulfur, selenium having two donor levels within the band gap in silicon, the levels lying approximately 310 meV and 590 meV, respectively, below the conduction band edge of the silicon.

The above-described effect occurs in the simplest form of the anode structure which is illustrated in FIG. 1a. The cathode structures of IGBTs (FIG. 2a), MCTs (FIG. 2b) or GTOs (FIG. 2c) or else of bipolar transistors or thyristors (not shown) can be attached along the dash-dotted line.

FIG. 2a shows a cathode structure of an IGBT. This structure includes an n-doped silicon layer 1, into whose cathodal main area 2 there are introduced a multiplicity of IGBT cells including p-doped base zones 13 and n-doped source zones 14 embedded therein. The introduction can be effected trough the use of implantation and/or diffusion. In this case, the cathode 4 is electrically conductively connected to the base zones 13 and the source zones 14. A gate electrode 15 insulated trough the use of an insulator 12, which is generally a gate oxide, is provided above the cathodal main area 2 and between two respective IGBT cells.

The current flow between the cathode 4 and the anode 5 can be switched on and off and be regulated in a known manner by the application of a voltage to the gate electrode 15.

FIG. 2b shows a cathode structure of an MCT. The starting point is once again an n-doped silicon layer 1. A p-doped base 20 and, therein, a plurality of n-doped cathode zones 21 are introduced into the cathodal main area 2 of the silicon layer 1. In this case, the cathode zones 21 are electrically conductively connected to the cathode 4. If a control current is applied to the gate 15, the current between anode 5 and cathode 4 can be switched on and off in a known manner.

The cathode structures according to FIGS. 2a to c can then be combined with the anode structure according to FIG. 1a, as explained at the beginning, so that IGBTs, MCTs or GTOs according to the invention can be provided.

The special situation in the case of power diodes is discussed below.

Power diodes have to be optimized with regard to their losses in exactly the same way as controllable power semiconductor components, that is to say IGBTs, MCTs, GTOs, thyristors and bipolar transistors, as were discussed previously, and with regard to their switching losses.

Therefore, here too the aim is to attain power semiconductor components with minimal thickness. Power diodes generally exhibit an abrupt current chopping at the end of the reverse recovery phase. This can lead to unacceptable voltage spikes even in the case of extremely small inductances. In order to avoid this risk, it is accordingly the case at the present time that power diodes are used which are still not optimized with regard to thickness, in other words power diodes which are far and away overdimensioned with regard to their thickness. However, this overdimensioning leads to additional switching losses in the electrical circuits.

On account of the current reversal, the stop layers in power diodes, and thus also the stop layer 7 according to the invention, are provided on the cathode side of the power diode. FIG. 3 shows such a diode. The anode 5, which is formed by an anode metallization layer 10, is followed by the transparent p-doped emitter 6, the n-doped silicon layer 1, and the n-doped stop layer 7 thereof. The diode shown here is provided with an n-doped cathode region 21. It is pointed out that, of course, instead of a continuous cathode region 21, it is also possible to provide a multiplicity of individual n-doped cathode regions.

The effect of the transparent emitter 6 and of the stop layer 7 essentially corresponds to that of controllable power semiconductor components described above. The stop layer 7 shown here is once again doped with selenium or with sulfur.

In this case, the dopant concentration $N_D$ in the stop layer 7 shown is dimensioned such that it is still flooded by charge carriers in the case of forward-biasing. Moreover, this influences the effectiveness of the stop layer 7 as an emitter as little as possible. In the event of commutation from the forward mode to the reverse mode, this flooding charge is slowly reduced as the electric field builds up in the stop layer 7. This leads to the gentle decrease in the reverse current in conjunction with a uniform rise in the reverse voltage at the power diode and thus to the desired switching behavior, the so-called "soft recovery" behavior. It goes without saying, however, that for specific uses the dopant concentration $N_D$ can also be set such that a "hard recovery" behavior is obtained.

For a power diode configured for example for a reverse voltage of 1200 V, the following have proved particularly advantageous: for the dimensioning of the p-doped anode emitter 6, a doping concentration of between $10^{16}$ and $10^{19}$ cm$^{-3}$ with a thickness of from 3 μm to 20 μm; for the silicon layer 1, a dopant concentration of between $10^{12}$ and $10^{14}$ cm$^{-3}$ with a thickness of between 80 μm and 150 μm; for the stop layer 7, a dopant concentration of between $10^{14}$ and $10^{16}$ cm$^{-3}$ and a thickness of between 10 μm and 50 μm.

When dimensioning the thickness and the dopant concentration of the silicon layer 1 and of the stop layer 7 it is taken into account that in the case of reverse-biasing, given the presence of the bulk breakdown voltage in the silicon, 1.3 to 1.8×10$^{12}$ atoms/cm$^2$ are ionized in the space charge zone. This charge per unit area is referred to as the breakdown charge and can easily be controlled in particular during the introduction of the dopants by ion implantation or via the deposition of epitaxial doping layers.

It turns out to be very difficult to fabricate the above-described layer sequence without using the invention. Up to a reverse voltage of about 1500 V, the silicon layer and the stop layer can expediently be deposited using epitaxy methods, as explained below. While the cathode zone represents the substrate material and the transparent emitter is usually produced by outdiffusion of implanted dopants or by diffusion from the vapor phase.

At higher reverse voltages, epitaxy proves to be technically and economically nonsensical due to the high layer thicknesses and the resultant severe fluctuations in thickness, as already discussed above. Therefore, at these high reverse voltages, use is made of substrate wafers into which the stop layers are driven at high temperature and with long diffusions before the transparent emitter is fabricated. Thus, when using conventional dopants such as phosphorus, arsenic or antimony, diffusion temperatures of above 1200° C. are required for the desired penetration depths. The diffusion then lasts more than 20 hours.

Depositing epitaxial layers as stop layer on a substrate forming the cathode layer leads to difficulties since the epitaxy step is in the active region of the component and usually has an increased crystal defect rate. An indiffused stop layer accordingly has advantages because it yields an almost perfect junction between the stop layer and the silicon layer 1.

When using diffused stop layers at the beginning of the processing, difficulties can arise if, during the processing of the anode side of the diode or of the cell array in the case of IGBTs, e.g. in the region of the edge structure, it is not possible to dispense with gettering layers on the rear side of the wafer. The latter layers can adversely affect the emitter properties. In addition, the very long diffusion time at the very high temperature vitiates an economically tenable manufacturing of power semiconductor diodes above a reverse voltage of about 1500 V.

Furthermore, power semiconductor components with lower reverse voltages are, however, also increasingly being fabricated on substrate material without epitaxial layers because the emitter properties of the cathode side cannot be obtained trough the use of highly doped carrier materials but rather have to be set in a targeted manner for optimized components. These components include the power diodes shown, with controlled, weak rear-side emitters.

The statements that have been made here can, of course, also be applied to the situation with the controllable power semiconductor components discussed in the introduction, in particular the non-punch-through IGBTs.

In order nevertheless to achieve low switching losses and low on-state or forward losses for these power semiconductor components with reverse voltages of above approximately 400 V, the outstanding diffusion properties of the dopants discussed, sulfur and selenium, at comparatively low temperatures are useful. This fortunate circumstance means that, during fabrication, power semiconductor components can be produced firstly using silicon wafers of conventional thickness, which are not brought to the final thickness until toward the end of the fabrication process, for example by thinning by grinding and etching.

In order to improve the on-state losses and in order to partly optimize the switching losses, it is the case nowadays when using stop layer techniques that the required doses of about $10^{12}$ to $10^{14}$ DA/cm$^2$ are preferably introduced by ion implantation. The annealing and activation of the implanted dose and also the drive-in step take place at temperatures of up to about 950° C.

As a typical implantation dose when using sulfur, a dose of between $10^{12}$ and $10^{14}$ sulfur atoms/cm$^2$ can be used. Compared with a comparable phosphorus dose, the use of such a sulfur dose results in a reduction of 10% of the voltage drop in the forward mode.

To summarize, it can be stated that the invention provides power semiconductor components, in particular for high reverse voltages, which have surprisingly good physical properties which have a positive effect on the switching losses and onstate losses. The power semiconductor components according to the invention can be made thin without any difficulty in an outstanding economical manner, so that not only new interesting semiconductor-physical effects but also interesting new production methods are revealed.

We claim:

1. A power semiconductor component, comprising:
   an n-doped silicon layer;
   a first main area and a second main area;
   a plurality of doped layers introduced into said n-doped silicon layer between said first main area and said second main area;
   said doped layers, as seen from said second main area, including a p-doped anode zone and an n-doped stop layer adjoining said p-doped anode zone;
   said n-doped silicon layer having a first dopant concentration, said n-doped stop layer having a second dopant concentration higher than said first dopant concentration, said n-doped stop layer adjoining and completely covering said n-doped silicon layer;
   said n-doped stop layer being doped with at least one dopant having at least one donor level between a valence band edge of silicon and a conduction band edge of silicon and the at least one donor level being more than 200 meV away from the conduction band edge of silicon, to form said n-doped stop layer non-epitaxially and without lengthy deep diffusion;
   a cathode assigned to said first main area and formed by a first metallization layer; and an anode formed by a second metallization layer covering said second main area.

2. The power semiconductor component according to claim 1, wherein said at least one dopant is selenium.

3. The power semiconductor component according to claim 1, wherein said at least one dopant is sulfur.

4. The power semiconductor component according to claim 1, wherein said at least one dopant includes selenium and sulfur.

5. The power semiconductor component according to claim 1, wherein said second dopant concentration is between $5 \times 10^{14}$ cm$^{-3}$ and $5 \times 10^{15}$ cm$^{-3}$.

6. The power semiconductor component according to claim 1, wherein said n-doped stop layer has a depth of between 1 μm and 50 μm.

7. The power semiconductor component according to claim 1, wherein said n-doped stop layer has a depth of between 10 μm and 25 μm.

8. The power semiconductor component according to claim 1, wherein said p-doped anode zone is embodied as a transparent emitter with a given depth and a given dopant concentration selected such that at least 50% of a total current flowing through said transparent emitter is carried by electrons.

9. The power semiconductor component according to claim 8, wherein said given depth of said transparent emitter is between 0.5 μm and 5 μm.

10. The power semiconductor component according to claim 1, including:
a plurality of IGBT cells including p-doped base zones and n-doped source zones being introduced from said first main area;
said cathode being electrically conductively connected to said p-doped base zones and said n-doped source zones;
a gate electrode provided above said first main area and between respective two of said IGBT cells; and
an insulator insulating said gate electrode.

11. The power semiconductor component according to claim 1, including:
a p-doped base introduced from said first main area;
a plurality of n-doped cathode zones introduced into said p-doped base; and
said n-doped cathode zones being electrically conductively connected to said cathode.

12. The power semiconductor component according to claim 1, including:
a plurality of MCT structures each including a p-type base, an n-type emitter, a channel region and a p-type short region,
said MCT structures being introduced from said first main area; and
a gate electrode disposed insulated above said first main area and between respective two of said MCT structures.

13. A power semiconductor component, comprising:
an n-doped silicon layer;
a first main area and a second main area;
a plurality of doped layers introduced into said n-doped silicon layer between said first main area and said second main area;
said doped layers, as seen from said second main area, including an anode zone, said n-doped silicon layer adjoining said anode zone, a stop layer adjoining said n-doped silicon layer, and an n-doped cathode zone adjoining said stop layer;

said n-doped silicon layer having a first dopant concentration, said stop layer having a second dopant concentration higher than said first dopant concentration, said stop layer completely covering said n-doped silicon layer;

said stop layer being doped with at least one dopant having at least one donor level between a valence band edge of silicon and a conduction band edge of silicon and the at least one donor level being more than 200 meV away from the conduction band edge of silicon, to form said n-doped stop layer non-epitaxially and without lengthy deep diffusion;

a cathode assigned to said first main area and formed by a first metallization layer; and an anode formed by a second metallization layer covering said second main area.

14. The power semiconductor component according to claim 13, wherein said at least one dopant is selenium.

15. The power semiconductor component according to claim 13, wherein said at least one dopant is sulfur.

16. The power semiconductor component according to claim 13, wherein said at least one dopant includes selenium and sulfur.

17. The power semiconductor component according to claim 13, wherein said second dopant concentration is between $5 \times 10^{14}$ cm$^{-3}$ and $5 \times 10^{15}$ cm$^{-3}$.

18. The power semiconductor component according to claim 13, wherein said stop layer has a depth of between 1 μm and 50 μm.

19. The power semiconductor component according to claim 13, wherein said stop layer has a depth of between 10 μm and 25 μm.

20. The power semiconductor component according to claim 13, wherein said stop layer has a depth of between 15 μm and 35 μm.

21. The power semiconductor component according to claim 13, wherein said anode zone is embodied as a transparent emitter with a given depth and a given dopant concentration selected such that at least 50% of a total current flowing through said transparent emitter is carried by electrons.

22. The power semiconductor component according to claim 21, wherein said given depth of said transparent emitter is between 0.5 μm and 5 μm.

23. The power semiconductor component according to claim 13, wherein said anode zone is embodied as a p-doped anode emitter.

24. The power semiconductor component according to claim 13, including an anode emitter embodied as a Schottky metallization.

25. A semiconductor component, comprising:
a MISFET having a source, a drain, and a parasitic diode;
said parasitic diode being reverse-connected in parallel from said source to said drain and said parasitic diode including:
an n-doped silicon layer;
a first main area and a second main area;
a plurality of doped layers introduced into said n-doped silicon layer between said first main area and said second main area;
said doped layers, as seen from said second main area, including an anode zone, said n-doped silicon layer adjoining said anode zone, and a stop layer adjoining said n-doped silicon layer;
said n-doped silicon layer having a first dopant concentration, said stop layer having a second dopant concentration higher than said first dopant concentration, said stop layer completely covering said n-doped silicon layer;

said stop layer being doped with at least one dopant having at least one donor level between a valence band edge of silicon and a conduction band edge of silicon and the at least one donor level being more than 200 meV away from the conduction band edge of silicon, to form said n-doped stop layer non-epitaxially and without lengthy deep diffusion;

a cathode assigned to said first main area and formed by a first metallization layer; and an anode formed by a second metallization layer covering said second main area.

* * * * *

UNITED STATES PATENT AND TRADEMARK OFFICE
CERTIFICATE OF CORRECTION

PATENT NO. : 6,441,408 B2  
DATED : August 27, 2002  
INVENTOR(S) : Alfred Porst et al.

It is certified that error appears in the above-identified patent and that said Letters Patent is hereby corrected as shown below:

<u>Title page,</u>  
Item [30], Foreign Application Priority Data, should read as follows:  
--  Foreign Application Priority Data

Jul. 17, 1998  (DE) ……………………... 198 32 310.7  
Oct. 23, 1988  (DE) ……………………... 198 48 985.4 --

Signed and Sealed this

Twenty-sixth Day of November, 2002

*Attest:*

*Attesting Officer*

JAMES E. ROGAN  
*Director of the United States Patent and Trademark Office*

UNITED STATES PATENT AND TRADEMARK OFFICE
CERTIFICATE OF CORRECTION

PATENT NO.     : 6,441,408 B2
DATED          : August 27, 2002
INVENTOR(S)    : Alfred Porst et al.

It is certified that error appears in the above-identified patent and that said Letters Patent is hereby corrected as shown below:

<u>Title page,</u>
Item [30], Foreign Application Priority Data, should read as follows:

--      Foreign Application Priority Data

Jul. 17, 1998   (DE) ……………………... 198 32 310.7
    Oct. 23, 1998  (DE) ……………………... 198 48 985.4 --

This certificate supersedes Certificate of Correction issued November 26, 2002.

Signed and Sealed this

First Day of April, 2003

JAMES E. ROGAN
*Director of the United States Patent and Trademark Office*